(12) United States Patent
Schrödinger

(10) Patent No.: US 7,224,709 B2
(45) Date of Patent: May 29, 2007

(54) ELECTRICAL CIRCUIT FOR A DIRECTLY MODULATED SEMICONDUCTOR RADIATION SOURCE

(75) Inventor: Karl Schrödinger, Berlin (DE)

(73) Assignee: Infineon Technologies AG, Munich (DE)

( * ) Notice: Subject to any disclaimer, the term of this patent is extended or adjusted under 35 U.S.C. 154(b) by 236 days.

(21) Appl. No.: 10/838,821

(22) Filed: May 4, 2004

(65) Prior Publication Data
US 2004/0264526 A1 Dec. 30, 2004

(30) Foreign Application Priority Data
May 6, 2003 (DE) ................ 103 20 333

(51) Int. Cl.
H01S 3/13 (2006.01)
H01S 3/00 (2006.01)
(52) U.S. Cl. ................ 372/38.07; 372/29.015
(58) Field of Classification Search ..... 372/38.1–38.09
See application file for complete search history.

(56) References Cited

U.S. PATENT DOCUMENTS

| | | |
|---|---|---|
| 6,272,160 B1 | 8/2001 | Stronczer |
| 6,285,692 B1 | 9/2001 | Okayasu |
| 6,597,209 B2 * | 7/2003 | Iguchi et al. ............... 327/108 |
| 6,947,456 B2 * | 9/2005 | Chin et al. ............... 372/38.02 |
| 2001/0028665 A1 * | 10/2001 | Stronczer ............... 372/38.02 |
| 2002/0105982 A1 | 8/2002 | Chin et al. |

FOREIGN PATENT DOCUMENTS

| | | |
|---|---|---|
| DE | 100 65 838 A1 | 7/2002 |
| DE | 102 18 939 A1 | 6/2003 |
| EP | 0 886 350 A1 | 12/1998 |
| JP | 2001320122 A | 11/2001 |

OTHER PUBLICATIONS

International Search Report, Patent No. 04090160.5, 3 pgs.

* cited by examiner

Primary Examiner—Minsun Harvey
Assistant Examiner—Marcia A. Golub
(74) Attorney, Agent, or Firm—Eschweiler & Associates, LLC

(57) ABSTRACT

The invention relates to an electrical circuit for a directly modulated semiconductor radiation source having a semiconductor radiation source, to which a modulated current is supplied in a manner dependent on a digital data signal, the falling signal edge of said current exhibiting peaking. According to the invention, provision is made of circuit means which are connected to an electrical contact point of the circuit and which reduce peaking of the falling signal edge when a predetermined value of the forward voltage across the semiconductor radiation source is undershot. This allows higher data rates to be achieved.

3 Claims, 4 Drawing Sheets

ELECTRICAL CIRCUIT FOR A DIRECTLY MODULATED SEMICONDUCTOR RADIATION SOURCE

REFERENCE TO RELATED APPLICATIONS

This application claims the benefit of the priority date of German application DE 103 20 333.8 filed on May 6, 2003, the contents of which are herein incorporated by reference in their entirety.

FIELD OF THE INVENTION

The invention relates to an electrical circuit for a directly modulated semiconductor radiation source.

BACKGROUND OF THE INVENTION

It is known to use laser diodes for the purpose of generating light in optical data transmission systems. In this case, the optical output power of a laser diode is determined by a driver circuit, which supplies a bias current to the laser diode, said bias current being modulated in a manner dependent on the data signal to be transmitted.

DE 100 65 838 A1 discloses an electronic driver circuit for directly modulated semiconductor lasers. Said document describes how a constant signal, which is intended to be used to transport an item of information, is superposed by means of so-called peaking. This peaking influences the rising and/or falling edges of the current through the semiconductor laser. Peaking is caused by a driver circuit and makes it possible for the current through the semiconductor laser and thus the emission of light to be switched on and off more rapidly. This makes it possible for the semiconductor laser to transmit a high data rate.

FIG. 5 (taken from DE 100 65 838 A1) illustrates peaking: FIG. 5 diagrammatically shows how a voltage $V_{pk}$ is superposed on the constant signal of the data transmission $V_{Dat}$. These two quantities yield the current $I_{VCSEL}$ flowing through the VCSEL laser. The voltage pulses $V_{Dat}$ and $V_{pk}$ and also the current pulses $I_{VCSEL}$ are plotted against time t. FIG. 3 diagrammatically shows the light radiation $LICHT_{HL}$ of a laser diode in dependence on the current flow $I_{HL}$ through the laser. In this case, the solid line in the diagram $I_{HL}$ relates to a data signal which has not been modulated by peaking and the dashed lines 1 and 2 indicate the behavior of the current through the laser if the signal has been modulated by peaking of varying magnitude. It can be seen in FIG. 3 that, as a result of peaking, the switch-on and switch-off edges of the light radiation $LICHT_{HL}$ become steeper and the laser light can be switched on and off more rapidly.

One disadvantage of the previously known circuit resides in the fact that peaking provides a negative current pulse, which lowers the forward voltage through the semiconductor radiation source to such an extent that switch-on delays may occur when the semiconductor radiation source is next switched on (that is to say in the event of the next positive current pulse). The switch-on delays depend on the lowering of the forward voltage across the semiconductor radiation source and correspond to the discharge of the diffusion capacitance. Exact matching of the negative current pulse to be used, for the purpose of improving the switch-off edge, proves to be technically impracticable since certain variations in the electrical and optical properties prevail in the components of the circuit.

SUMMARY OF THE INVENTION

The invention is based on the object of providing an electrical circuit for a directly modulated semiconductor radiation source, which can provide a high data transmission speed by means of a semiconductor radiation source. In particular, disadvantageous effects which can arise as a result of peaking of the falling signal edge of a modulated current through the semiconductor laser diode are to be avoided.

The electrical circuit accordingly has a semiconductor radiation source, to which a modulated current is supplied in a manner dependent on a digital data signal. The falling signal edges of said current exhibit peaking. When a predetermined value of the forward voltage across the semiconductor radiation source is undershot, peaking of the falling signal edge is reduced or prevented by circuit means which are connected to an electrical contact point of the circuit. In particular, when the predetermined value of the forward voltage is undershot, the semiconductor radiation source is not discharged any further and further lowering of the forward voltage is prevented.

This prevents the diffusion capacitance of the semiconductor radiation source from being excessively discharged and reverse voltages being formed across the latter. Differently charged diffusion capacitances would give rise to switch-on delays of varying length, said switch-on delays generating undesirable jitter. The circuit means preferably form a type of "clamping circuit", which is connected to the existing circuit at the electrical contact point, or a discharge pulse controller.

The circuit means are preferably distinguished by the fact that they at least partially divert or switch off the current through the semiconductor radiation source when the predetermined value of the forward voltage is undershot.

In a preferred refinement of the invention, the circuit means allow the current flowing through the semiconductor radiation source to flow away through the circuit means as soon as the voltage across the semiconductor radiation source reaches the predetermined value of the forward voltage. As a result, the current through the semiconductor radiation source is diverted and flows away through the clamping circuit.

The circuit means preferably have at least one transistor, which is turned off as long as the voltage applied to the semiconductor radiation source is above the considered predetermined value of the forward voltage across the semiconductor radiation source. The transistor is turned on as soon as the voltage reaches the predetermined limit value. This may be effected, for example, by a transistor of this type being, for example, a PNP or an NPN transistor whose base is connected to a DC voltage source and whose emitter is connected to the electrical contact point to the semiconductor radiation source. As of a particular value of the forward voltage through the semiconductor radiation source, the transistor is turned on in a manner dependent on the voltage provided by the DC voltage source.

In a preferred refinement of the invention, the clamping circuit has a PNP transistor and the semiconductor radiation source has a cathode, which is connected to a fixed electrical potential and is connected to the emitter terminal of the PNP transistor. As of a certain voltage across the semiconductor radiation source, a current is fed through the PNP transistor (p channel) and further discharge of the semiconductor radiation source is avoided.

A configuration which is analogous to the above configuration provides for the clamping circuit to have an NPN transistor and for the semiconductor radiation source to have an anode, which is connected to a fixed electrical potential and is connected to the emitter terminal of the NPN transistor. Field effect transistors of any desired design may of course also be used.

In an alternative preferred refinement of the invention, peaking of the falling signal edge is reduced by means of corresponding control of the peaking pulses. To this end, provision is made, for example, for the circuit means to have a discharge pulse controller, which supplies a voltage or current signal to a circuit providing peaking when a predetermined value of the forward voltage is undershot, said voltage or current signal turning off peaking of the edge considered, that is to say the negative pulse current is prematurely terminated by means of a switching-off operation. This also makes it possible to prevent further discharge of the semiconductor radiation source. The circuit providing peaking has a transistor, for example, the voltage signal being supplied to the base of the transistor.

The circuit means or the clamping circuit measure(s), in a certain manner, the voltage applied to the semiconductor radiation source or the current flowing through the latter. If the measured voltage or the measured current undershoots a predetermined value, the current is discharged into the clamping circuit or the negative pulse current is prematurely terminated by means of a switching-off operation. In this case, the voltage or the current is "measured" automatically, if appropriate, insofar as a circuit is activated when a considered limit value is reached. However, provision may also be made in principle for a measurement signal to be ascertained first of all and for the latter to then be supplied to a control circuit.

A further preferred configuration provides for the clamping circuit to have at least one electrical contact point to a circuit having a directly modulated VCSEL laser. These lasers are particularly suited to rapid data transmission. The semiconductor radiation source may also preferably be a light-emitting diode.

The clamping circuit preferably has an electrical connection to a constant potential point, in particular to electrical ground. This electrical contact point to a constant potential is used to discharge the current flowing through the semiconductor radiation source to the constant potential point, if appropriate via the clamping circuit.

BRIEF DESCRIPTION OF THE DRAWINGS

The invention is explained in more detail below using a plurality of exemplary embodiments and with reference to the figures of the drawing, in which.

DETAILED DESCRIPTION OF THE INVENTION

Figure 5:
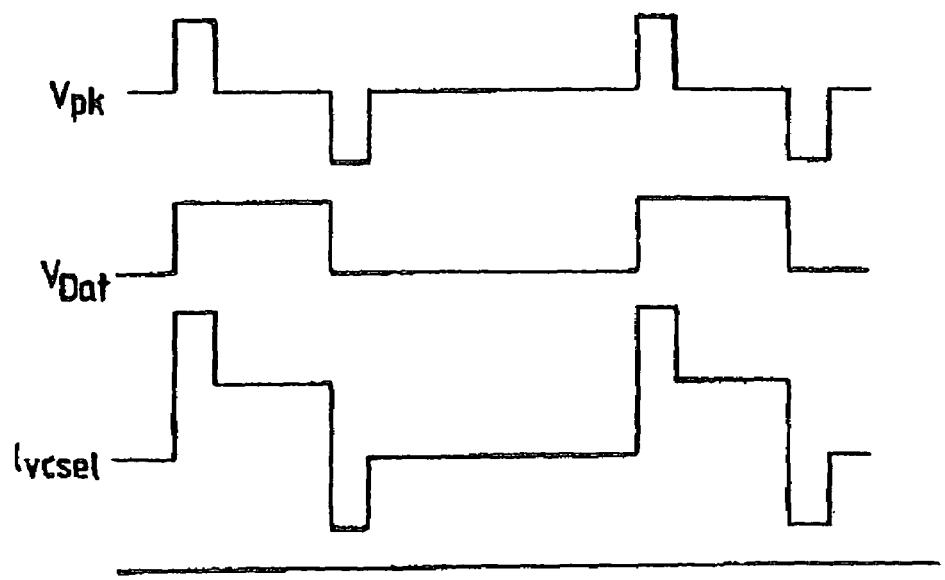
FIG. 5 shows the temporal sequence of peaked pulses in a driver circuit for a semiconductor radiation source in accordance with the prior art.

The temporal sequence of the current and voltage pulses during the known peaking was explained initially with reference to FIG. 5.

Figure 4:
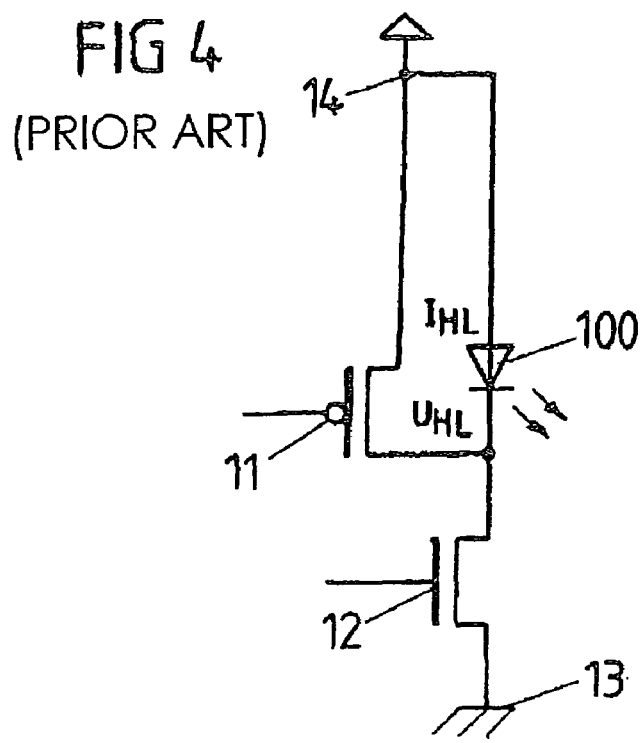
FIG. 4 shows a circuit diagram of a modulated semiconductor radiation source in accordance with the prior art.

FIG. 4 shows a known circuit diagram of a modulated semiconductor radiation source 100. In this circuit diagram, the semiconductor radiation source 100 is an LED having an anode and cathode. It may likewise be any desired laser diode. A current $I_{HL}$ which has been modulated in accordance with a signal to be transmitted is applied to the LED 100 via a modulated current source 12. Peaking pulses which give rise to peaking of the edges of the current through the LED 100 (as illustrated in FIG. 5) are additionally provided via a transistor 11.

The shape particularly of the switch-on and switch-off edges of the signal of the current $I_{HL}$ through the semiconductor radiation source 100 and the voltage across the semiconductor radiation source 100 are important for rapid data transmission.

Figure 3:
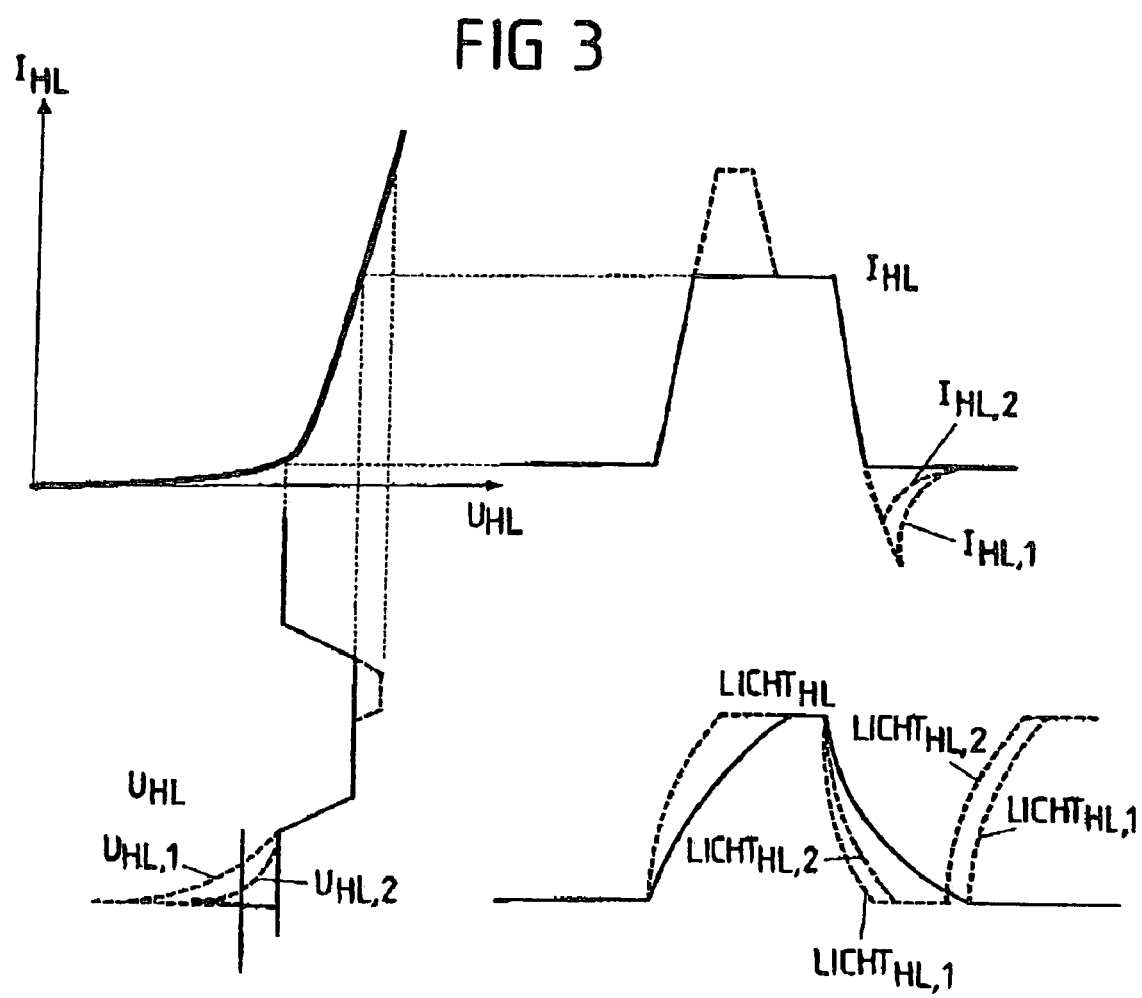
FIG. 3 shows a current-voltage characteristic curve of a semiconductor radiation source together with the associated signal pulse shapes for current, voltage and light.

FIG. 3 shows the current-voltage characteristic curve at the semiconductor radiation source 100 of FIG. 4 and also the signal pulse shapes for current, voltage and light of the semiconductor radiation source.

In this case, the current $I_{HL}$ through the semiconductor radiation source is shown as a function of the voltage $U_{HL}$. As usual, the characteristic curve of a diode has a very gentle current rise at low voltages $U_{HL}$ but, above a certain limit value, the current $I_{HL}$ rises in an essentially linear manner. This linear range represents the desired operating range of the semiconductor radiation source: the voltage $U_{HL}$ and the current $I_{HL}$, respectively, should not fall below the range of the linear steep rise of the current. A smaller voltage applied to the semiconductor radiation source would signify a delay when the semiconductor light source is switched on since the voltage required for the emission of light at the semiconductor radiation source 100 would first have to be built up. It is therefore desirable to maintain a certain residual voltage across the semiconductor radiation source.

The signal pulse shape for the current $I_{HL}$ of the characteristic curve is shown on the top right next to the characteristic curve. The solid line shows a normal essentially rectangular signal waveform which does not exhibit any peaking. The dashed lines relate to a signal pulse shape which has been modulated by peaking. In this case, an additional current pulse is provided by the semiconductor radiation source both when switching on and when switching off the signal.

Provision is accordingly made of an elevated switch-on edge having an essentially rectangular shape and a switch-off edge having an essentially triangular shape that falls a particularly long way below the desired operating range of the semiconductor radiation source.

The light power of the semiconductor radiation source is illustrated on the bottom right in FIG. 3. A negative voltage $U_{HL}$ is applied to the semiconductor radiation source for the purpose of improving the steepness of the switch-off edge of the light radiation $LICHT_{HL}$ of the semiconductor radiation source. The pulse shapes $I_{HL,1}$ and $I_{HL,2}$ shown in FIG. 3 are produced in a manner dependent on the magnitude of said negative current. In this case, the first pulse shape $I_{HL,1}$ has a larger negative current magnitude than the second pulse shape $I_{HL,2}$.

FIG. 3 furthermore shows, on the bottom left, the associated signal pulse shape of the voltage $U_{HL,1,2}$. In this case too, the essentially rectangular signal pulse shape (illustrated by means of a solid line) shows the voltage $U_{HL}$ for a semiconductor radiation source which has not been additionally modulated by peaking. The dashed lines $U_{HL,1,2}$ indicate the pulse shape for a modulated signal and, as in the case of the current $I_{HL}$, have an essentially rectangular shape for the switch-on edge and an essentially triangular shape of varying size for the switch-off edge.

As mentioned, FIG. 3 shows, on the bottom right, the light radiation $LICHT_{HL}$ which is associated with the two signal pulse shapes for $I_{HL}$ and $U_{HL}$ and is emitted by the semiconductor radiation source. It can be seen here that, in the case of a signal which has not been modulated by peaking (solid line), the power of the light radiation $LICHT_{HL}$ does not have an approximately rectangular shape but flat switch-on and switch-off edges. These switch-on and switch-off edges become steeper in the case of signal pulse shapes which have been modulated by peaking (dashed lines). In this case, the switch-off edge is steeper, the greater the negative magnitude of the reverse current when switching off the signal pulse. The first pulse shape $LICHT_{HL,1}$ therefore exhibits a steeper edge than the second pulse shape $LICHT_{HL,2}$.

The illustration of the light power furthermore shows the switch-on edge for a subsequent pulse signal. In this case, it is apparent that the signal having the second pulse shape $LICHT_{HL,2}$, which does not fall to such a great extent, can be switched on again at an earlier point in time than the signal having the first pulse shape $LICHT_{HL,1}$ with the larger negative current magnitude when the pulse signal is switched off. In the case of the first pulse shape, a negative reverse current thus delays the rapid switching-on again of the light of the semiconductor radiation source. The circuits described below prevent or diminish this negative effect of the peaking which is desired per se.

Figure 1:
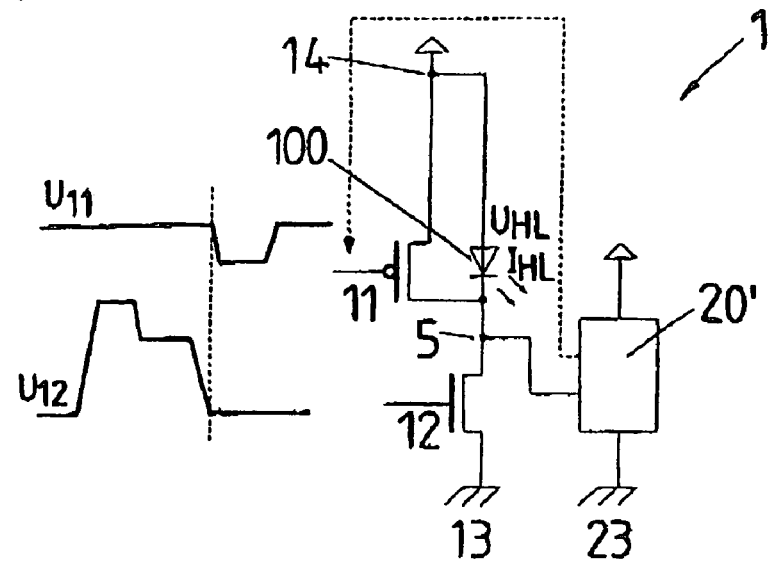
FIG. 1 shows a circuit diagram of a modulated semiconductor radiation source having a diagrammatically illustrated discharge pulse controller.

FIG. 1 shows a circuit diagram of a modulated semiconductor radiation source 100 having a diagrammatically illustrated discharge pulse controller 20'.

The circuit illustrated in FIG. 1 corresponds, except for the discharge pulse controller 20', to the circuit of FIG. 4. A voltage signal $U_{12}$ is supplied to the gate terminal of the transistor 12, which is used as the current source of the circuit. Said voltage signal has been modulated in accordance with the data to be transmitted and, in addition, has a peaking signal at the respective rising edge of a voltage pulse. The current flowing through the semiconductor radiation source has been correspondingly modulated, cf. FIG. 3.

Negative peaking pulses $U_{11}$ for the falling edge of the current signal are provided at the further transistor 11. The transistor 11 is part of a circuit which is known per se for generating peaking pulses, so that said circuit will not be discussed any further.

The discharge pulse controller 20' is connected to the cathode of the semiconductor radiation source 100 via a contact point 5 and furthermore has an electrical connection to a constant potential point 23, electrical ground in this case.

The discharge pulse controller 20' prevents excessive peaking of the falling signal edge of a current pulse through the semiconductor radiation source. To this end, the discharge pulse controller 20' measures the voltage across the semiconductor radiation source 100. When a particular value is reached, the peaking circuit for the falling edge considered is deactivated. From a particular point on, further discharge of the semiconductor radiation source is therefore prevented. In accordance with this statement, the forward voltage $U_{HL}$ of the semiconductor radiation source 100 does not fall to an excessively great extent, in particular does not fall below the range of the linear rise of the current-voltage characteristic curve of FIG. 3.

As is shown in FIG. 1 by means of a dashed line, provision is made for the discharge pulse controller 20' to be connected in this case to the transistor 11 of the peaking circuit. This connection makes it possible for the discharge pulse controller 20' to supply a current or voltage signal to the peaking circuit, said current or voltage signal deactivating the peaking circuit for the falling edge considered, with the result that the negative current pulse through the semiconductor component is limited at the falling edge. When the threshold voltage is undershot, the negative pulse current is therefore prematurely terminated by means of a switching-off operation.

Figure 6:
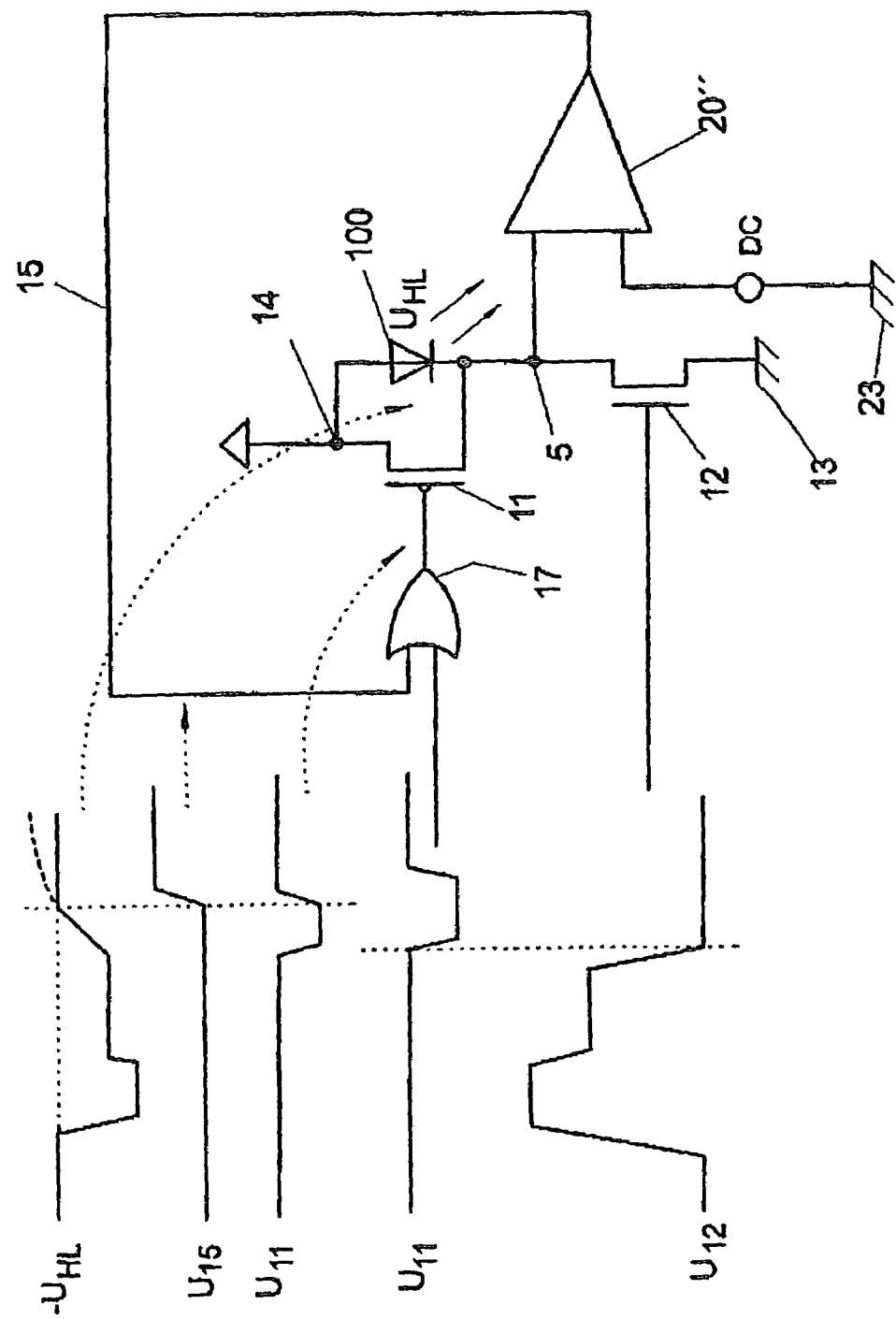
FIG. 6 shows an exemplary embodiment of a modulated semiconductor radiation source having a discharge pulse controller.

The discharge pulse controller of FIG. 1 and the voltages which occur are illustrated in more detail in an exemplary embodiment in FIG. 6. The discharge pulse controller has a comparator 20", which compares the voltage across the node 5 with a predetermined voltage value. The comparator 20" has two inputs which are connected to two comparison voltages. The voltage $U_{HL}$ of the semiconductor radiation source 100 is applied to the first input via the contact point 5. Said voltage $U_{HL}$ is compared with a predetermined threshold value. The threshold value is set by a DC voltage source DC, which is connected to the second input of the comparator 20".

If the voltage $U_{HL}$ across the semiconductor radiation source 100 undershoots the predetermined threshold value, a control signal is produced, which is supplied to a first input of a logic OR element 17 via a connection 15, said logic OR element being connected upstream of the transistor 11 of the peaking circuit.

The shape of this signal indicates the voltage profile $U_{15}$. A voltage $U_{11}'$ which provides the peaking signal of the switch-off operation is applied to a second input of the OR element 17. The two signal voltages $U_{11}'$ and $U_{15}$ determine the output voltage $U_{11}$, which is applied to the transistor 11 via the output of the OR element.

The method of operation is explained with reference to the voltages $U_{12}$, $U_{11}'$, $U_{11}$, $U_{15}$ and $-U_{HL}$. During the voltage pulse $U_{12}$ (which contains the data signal to be transmitted), the voltage $U_{11}'$ is at logic ONE and the voltage $U_{15}$ is at logic ZERO. This means that the voltage $U_{11}$ at logic ONE is across the output of the OR element 17 and across the transistor 11. The transistor 11 is turned off for this case. After the signal $U_{12}$ has ended, the signal $U_{11}'$ is then set to logic ZERO by the peaking circuit for negative peaking of the switch-off edge of the light signal. This means that the signal at logic ZERO is applied to both inputs of the OR element 17. The transistor 11 is then turned on. The voltage across the semiconductor radiation source 100 can be dissipated via the transistor 11.

If the voltage $U_{HL}$ across the semiconductor radiation source 100 then reaches the predetermined threshold value, the comparator output sets the signal $U_{15}$ to logic ONE. This causes the output of the OR element 17 to likewise be set to logic ONE: the transistor 11 is then turned off and further discharge of the semiconductor radiation source 100 is prevented. The comparator 20" is thus used to give rise to a premature end of the negative pulse $U_{11}'$ (as seen in signal $U_{11}$).

As soon as the voltage $U_{HL}$ across the semiconductor radiation source 100 reaches the threshold value, it remains at this value until the next positive pulse. It would fall further (dashed line) if the comparator did not switch off the negative pulse $U_{11}$. The diffusion capacitance of the semiconductor radiation source would then be excessively discharged.

The comparator 20" preferably has hysteresis which prevents the system from oscillating at the low level while the voltage $U_{HL}$ is close to the predetermined threshold value. The comparator is furthermore controlled in such a manner that it can be activated only at the switch-off edge of the signal.

Figure 2:
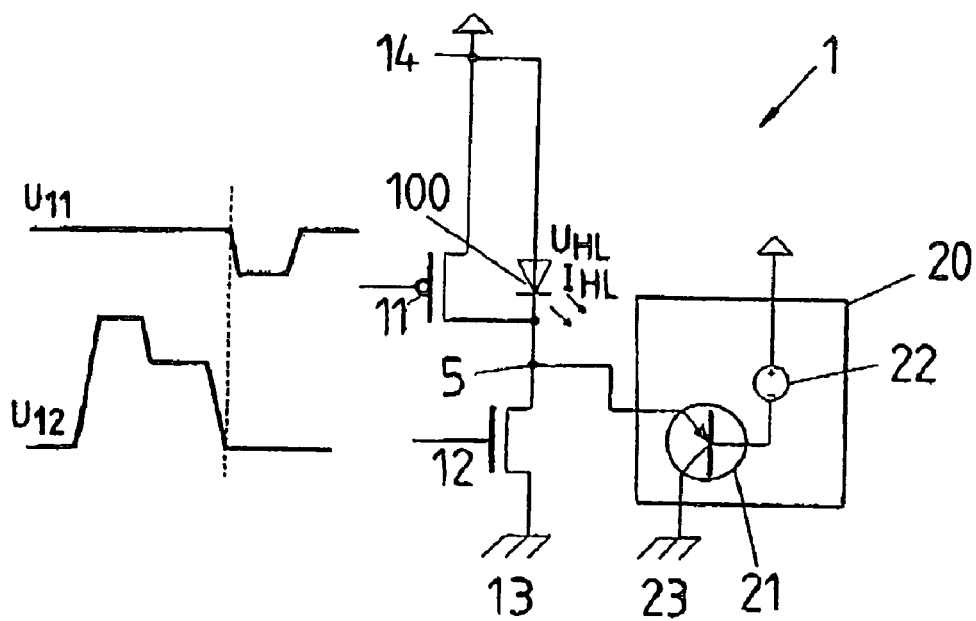
FIG. 2 shows a circuit diagram of a modulated semiconductor radiation source having an exemplary embodiment of a clamping circuit.

A circuit diagram of an alternative modulated semiconductor radiation source 100 having a clamping circuit 20, which replaces the discharge pulse controller 20' of FIG. 1, can be seen in FIG. 2. The circuit of FIG. 2 otherwise corresponds to the circuit of FIG. 1.

The clamping circuit 20 monitors the forward voltage through the semiconductor radiation source 100. When a particular forward voltage is undershot, that is to say as of a particular value of the forward voltage at the falling edge, the negative current signal pulse $I_{HL}$ (cf. FIG. 3) no longer flows away through the semiconductor radiation source 100 but rather through the clamping circuit 20. The fact that this negative current pulse does not flow through the semiconductor radiation source 100 prevents the forward voltage across the semiconductor radiation source from being lowered too much or the latter being excessively discharged, which would delay a subsequent signal pulse.

The clamping circuit 20, which is connected to the cathode of the semiconductor radiation source 100 via the contact point 5, has a PNP transistor 21, the emitter of which is connected to the cathode of the semiconductor radiation source 100 via the contact point 5. The base of the transistor 21 is connected to the negative pole of a DC voltage source 22. The positive pole of the DC voltage source 22 is connected to a supply voltage via a contact point. The collector terminal of the transistor 21 is connected to the constant potential point 23.

If the voltage $U_{HL}$ across the semiconductor radiation source 100 is then above a particular limit value (which can be set by the level of the DC voltage source 22), the transistor 21 is turned off. No current then flows through the transistor 21. However, if the voltage $U_{HL}$ across the semiconductor radiation source 100 undershoots this set limit value, the transistor 21 is automatically turned on and the current $I_{HL}$ at the semiconductor radiation source 100 flows away through the p channel of the transistor 21 to the constant potential point 23. This prevents the forward voltage $U_{HL}$ across the semiconductor radiation source 100 from being lowered too much, which would delay switching-on again of the semiconductor radiation source 100.

The implementation of the invention is not restricted to the exemplary embodiments depicted. In particular, the realization of the clamping circuit shown in FIG. 2 is to be understood merely as an example. Differently constructed driver circuits may also be used for the semiconductor laser diode. The essential factor is solely that peaking of the falling signal edge is reduced when a predetermined value of the forward voltage across the semiconductor radiation source is undershot, so that a new signal pulse can be emitted more rapidly.

LIST OF REFERENCE SYMBOLS

1 Electrical circuit
5 Electrical contact point
11 Transistor of the peaking circuit
12 Transistor
13 Ground
14 Contact point with supply voltage
15 Connection
17 OR element
20 Clamping circuit
20' Discharge pulse controller
20" Comparator
21 Transistor
22 DC voltage source
23 Ground
100 Semiconductor radiation source
$I_{HL}$ Current through the semiconductor radiation source 100
$I_{HL,1}$ First current pulse shape
$I_{HL,2}$ Second current pulse shape
$U_{HL}$ Voltage across the semiconductor radiation source 100
$U_{HL,1}$ First voltage pulse shape
$U_{HL,2}$ Second voltage pulse shape
$LICHT_{HL}$ Light radiation of the semiconductor radiation source 100
$LICHT_{HL,1}$ First light pulse shape
$LICHT_{HL,2}$ Second light pulse shape
$U_{11}$ Voltage across transistor 11
$U_{12}$ Voltage across transistor 12
$U_{11}'$ Voltage of peaking circuit across OR element 17
$U_{15}$ Voltage of comparator 20" across OR element 17
DC voltage source

The invention claimed is:

1. An electrical circuit for a directly modulated semiconductor radiation source, comprising:
   a semiconductor radiation source having a modulated current supplied thereto based on a digital data signal, wherein the falling signal edge of the current exhibits peaking;
   circuit means connected to an electrical contact point of the circuit and operable to reduce or prevent peaking of the falling signal edge of the current when a forward voltage across the semiconductor radiation source falls below a predetermined level,
      wherein the circuit means comprises a discharge pulse controller that reduces peaking of the falling signal edge of the current by means of corresponding control of peaking pulses,
      wherein the discharge pulse controller supplies a voltage or current signal to a circuit providing peaking when the forward voltage falls below the predetermined level, said voltage or current signal switching off peaking of the edge considered, and
      wherein the discharge pulse controller comprises a comparator that compares a voltage across the electrical contact point with a predetermined voltage value and generates a voltage or current signal which is supplied to the circuit providing peaking when the voltage across the electrical contact point is greater than the predetermined voltage value.

2. An electrical circuit for a directly modulated semiconductor radiation source, comprising:
   a semiconductor radiation source having a modulated current supplied thereto based on a digital data signal, wherein the falling signal edge of the current exhibits peaking;
   circuit means connected to an electrical contact point of the circuit and operable to reduce or prevent peaking of the falling signal edge of the current when a forward voltage across the semiconductor radiation source falls below a predetermined level,
      wherein the circuit means comprises a discharge pulse controller that reduces peaking of the falling signal edge of the current by means of corresponding control of peaking pulses, wherein the discharge pulse controller supplies a voltage or current signal to a circuit providing peaking when the forward voltage falls below the predetermined level, said voltage or current signal switching off peaking of the edge considered, and wherein the circuit providing peaking comprises a transistor and the voltage or current signal is supplied to an OR circuit, which is connected upstream of a control terminal of the transistor.

3. A semiconductor radiation source modulation circuit, comprising:

a semiconductor radiation source;

a driver circuit configured to drive the semiconductor radiation source in accordance with a peaking control technique, wherein a modulation current is superimposed over a data signal; and a discharge pulse controller coupled to the driver circuit, and configured to control the driver circuit to prevent a forward voltage across the semiconductor radiation source from falling below a predetermined level by reducing excessive peaking on falling edges when a limit value of the forward voltage has been reached, wherein the discharge pulse controller comprises a comparator circuit having a first input coupled to the semiconductor radiation source and a second input coupled to a comparison voltage, and wherein the comparator further comprises an output that provides a control signal to the driver circuit when the voltage at the first input exceeds the comparison voltage, and wherein the control signal is operable to alter the driver circuit to prevent the forward voltage from falling below the predetermined level.

* * * * *